(12) United States Patent
Wiesgickl et al.

(10) Patent No.: US 8,933,762 B2
(45) Date of Patent: Jan. 13, 2015

(54) ABSORBER UNIT FOR A BUS SYSTEM

(75) Inventors: Bernhard Wiesgickl, Vilseck (DE);
Stefan Wiesgickl, Vilseck (DE)

(73) Assignee: Siemens Aktiengesellschaft, Munich (DE)

( * ) Notice: Subject to any disclaimer, the term of this patent is extended or adjusted under 35 U.S.C. 154(b) by 617 days.

(21) Appl. No.: 13/258,513

(22) PCT Filed: Mar. 26, 2009

(86) PCT No.: PCT/EP2009/053593
§ 371 (c)(1),
(2), (4) Date: Sep. 22, 2011

(87) PCT Pub. No.: WO2010/108546
PCT Pub. Date: Sep. 30, 2010

(65) Prior Publication Data
US 2012/0013420 A1    Jan. 19, 2012

(51) Int. Cl.
*H03H 7/24*    (2006.01)
*G06F 13/40*    (2006.01)
(52) U.S. Cl.
CPC ............. *G06F 13/4072* (2013.01); *H03H 7/24* (2013.01)
USPC ........................................ 333/17.2; 333/81 R
(58) Field of Classification Search
USPC .............. 333/17.2, 22 R, 81 R, 81 A, 18, 181
See application file for complete search history.

(56) References Cited

U.S. PATENT DOCUMENTS

| 5,684,831 A | 11/1997 | Moller |
| 6,031,432 A * | 2/2000 | Schreuders ................. 333/24 R |
| 6,265,912 B1 | 7/2001 | Kamiya |

FOREIGN PATENT DOCUMENTS

DE    10 2006 048 109 A1    4/2008

OTHER PUBLICATIONS

Chinese Office Action dated Oct. 10, 2013.
International Search Report for International Application No. PCT/EP2009/053593 filed Mar. 26, 2009.

* cited by examiner

*Primary Examiner* — Stephen Jones
(74) *Attorney, Agent, or Firm* — Harness, Dickey & Pierce

(57) ABSTRACT

An absorber unit is disclosed for increasing the noise immunity of a system bus. In order to improve the noise immunity of the system bus, the system bus is designed such that communication can take place in a defined communication frequency spectrum. In at least one embodiment, the absorber unit includes a high-pass filter and an absorber resistor. The high-pass filter can be connected to the system bus on the input side and to the absorber resistor on the output side and is dimensioned such that is has a low-impedance effect for noise signals above the communication frequency spectrum so that those signals are absorbed by the absorber resistor.

20 Claims, 1 Drawing Sheet

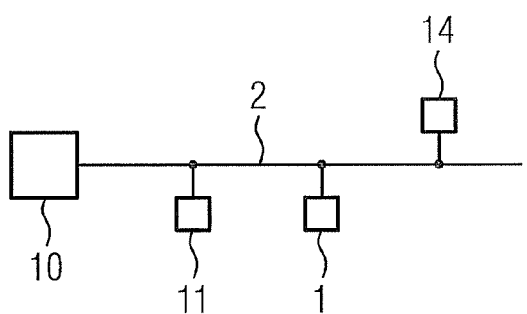
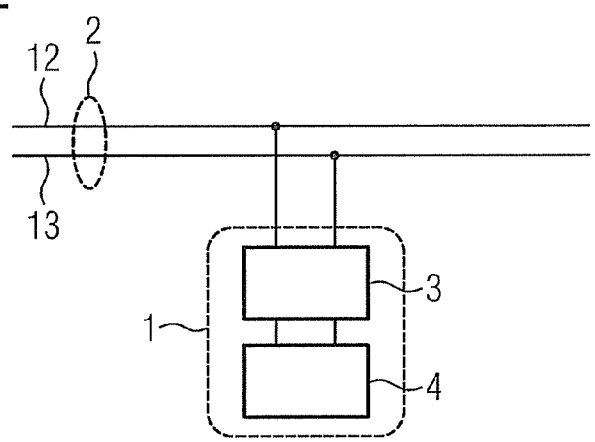
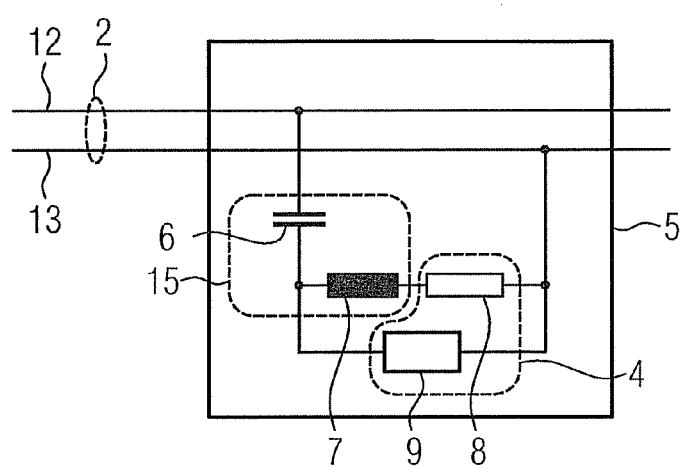

ABSORBER UNIT FOR A BUS SYSTEM

PRIORITY STATEMENT

This application is the national phase under 35 U.S.C. §371 of PCT International Application No. PCT/EP2009/053593 which has an International filing date of Mar. 26, 2009, which designates the United States of America, the entire contents of each of which are hereby incorporated herein by reference.

FIELD

At least one embodiment of the invention generally relates to an absorber unit for increasing the noise immunity of a system bus.

BACKGROUND

Within the field of industrial automation technology, bus systems such as e.g. Ethernet, Profibus, Interbus, Modbus, AS-Interface bus, etc. are also used for communication between devices instead of the wiring-intensive parallel wiring schemes. In terms of its immunity to EMC interference (EMC=Electromagnetic Compatibility) the AS-Interface bus system in particular is designed to cope with conditions in industrial environments. The EMC interference can be minimized by way of an appropriately structured configuration of the bus system line, though in some installations excessive levels of noise are nonetheless generated which disrupt communication on the bus so severely that the communication on the bus system collapses. Such a breakdown is extremely undesirable, since virtually any interruption of the bus communication leads to system malfunctions and hence to costly production downtimes. Due to the fact that the excessive noise levels mostly occur sporadically, eliminating the cause is very difficult and time-consuming.

SUMMARY

At least one embodiment of the the invention is to improve the noise immunity of a system bus.

At least one embodiment of the invention is directed to an absorber unit for increasing the noise immunity of a system bus, wherein the system bus is designed to enable communication to take place in a defined communication frequency spectrum, wherein the absorber unit comprises a high-pass filter and an absorber resistor, wherein the high-pass filter can be connected to a system bus on the input side and to the absorber resistor on the output side and is dimensioned such that it has a low-impedance effect for noise signals that lie above the communication frequency spectrum so that said noise signals are absorbed by the absorber resistor.

At least one embodiment of the invention is directed to a method for increasing the noise immunity of a system bus, wherein communication takes place in a defined communication frequency on the system bus, wherein a high-pass filter is connected to the system bus on the input side and to an absorber resistor on the output side and is dimensioned such that it has a low-impedance effect for noise signals that lie above the communication frequency spectrum so that said noise signals are absorbed by the absorber resistor.

Further advantageous embodiment variants will emerge from the dependent claims.

If the system bus is now subject to undesirable EMC interference, noise signals that lie above the communication frequency spectrum on the system bus are diverted via the high-pass filter and absorbed with the aid of the absorber resistor. Negative reflections caused by the noise signal can be avoided in this way. The system bus and consequently an overall system which communicates via the system bus including absorber unit therefore experience an enormous improvement in terms of noise immunity.

By way of at least one embodiment of the invention it is possible to reduce a noise spectrum or, as the case may be, a noise signal lying outside the communication frequency spectrum that has been coupled-in onto the system bus and so further improve the noise immunity of the overall system. Filtering measures for improving the signal quality are typically implemented using a receive decoder that is connected to the system bus. With this approach a low-pass filter, for example, is connected upstream thereof so that an unwanted higher-frequency noise spectrum cannot get through to the receive decoder.

For technical and economic reasons, however, suppressing the noise spectrum in such a way is possible only with a finite quality, which means that there is a continuing need for action in order to deal with unwanted noise spectra. Moreover, with the conventional method the undesirably coupled-in noise spectrum continues to be present. This disadvantage is removed by way of the measure according to at least one embodiment of the invention and the unwanted noise spectra substantially reduced.

In an advantageous embodiment variant of the invention the communication frequency spectrum lies between 40 kHz and 500 kHz.

Such a communication frequency spectrum is used, for example, in AS-Interface bus systems. In the normal case an EMC noise spectrum is at a much higher frequency (up to in excess of 100 MHz). Based on the communication frequency spectrum used, it is therefore possible to support stable communication without a direct overlap being present with the typically occurring noise spectra.

In a further advantageous embodiment variant of the invention the system bus represents an AS-Interface bus.

By way of the absorber unit according to at least one embodiment of the invention the AS-Interface bus and therefore an overall AS-Interface bus system can be considerably improved in terms of its noise immunity with respect to EMC interference. This represents an enormous and significant improvement, in particular for the AS-Interface bus system, which is designed for industrial environments. Downtimes, in common with communication faults, can have fatal consequences in an industrial environment. A substantial contribution toward improving the noise immunity of a system bus is made by means of the absorber unit according to at least one embodiment of the invention.

In a further embodiment variant of the invention the absorber unit is embodied by way of an attenuated series resonant circuit.

Leading high-frequency interference to an absorber resistor via a high-pass filter, in the present example embodiment a series resonant circuit, enables the high-frequency interference to be dissipated and absorbed more effectively. Compared with the first-order high-pass filter, the resonant circuit has a steeper characteristic curve in terms of its transmission function, which has a positive impact on the scenario described. In this case the high-pass filter should be dimensioned such that it does not affect the communication frequency spectrum used.

In a further embodiment variant of the invention a resonant frequency of the attenuated series resonant circuit lies between 6 to 10 MHz, preferably at 8 MHz.

In this way unwanted high-frequency noise signals, in particular in AS-Interface bus systems, can be filtered and absorbed in an optimal manner.

In an advantageous embodiment of the invention, an absorber unit according to at least one embodiment of the invention is integrated in the master, the master being configured for communication on the system bus.

This allows the absorber unit to be integrated into an existing system component, with the result that no additional component needs to be attached to the system bus. Furthermore the absorber unit is installed at one end of the system bus so that the reflections of the noise signal, which are usually generated at one end of the system bus, can be diverted directly via the absorber unit and absorbed.

In a further embodiment variant of the invention the absorber unit is integrated in a power supply which is configured for the system bus.

In this case the same advantages are derived as in the case of the integration of the absorber unit into the master unit.

In a further embodiment variant of the invention the absorber unit is essentially connected to the system bus at one end thereof.

This enables reliable dissipation and absorption of noise signals on the system bus such that the reflections of the noise signal which are typically produced at one end of the system bus can be discharged directly via the absorber unit.

In a further embodiment variant of the invention, the absorber unit is connected to the system bus in the vicinity of a source of interference.

This has the advantage that the noise signals are dissipated via the absorber unit and absorbed directly at the "source". Consequently the noise signals cannot disperse over the system bus.

BRIEF DESCRIPTION OF THE DRAWINGS

The invention and embodiments of the invention are described and explained in more detail below with reference to the example embodiments depicted in the figures, in which:

FIG. 1 shows a schematic layout of a bus system,

FIG. 2 shows a two-wire system bus which has an absorber unit, and

FIG. 3 is a schematic diagram representing an absorber unit as an attenuated series resonant circuit.

DETAILED DESCRIPTION OF THE EXAMPLE EMBODIMENTS

Referring to FIG. 1, a bus system has a master 10, a power supply 11, a slave 14, and an absorber unit 1. All the components 10, 11, 14, 1 are interconnected via a system bus 2. If unwanted noise signals are now coupled-in and transmitted on the system bus 2, the noise signal can be filtered out and absorbed with the aid of the absorber unit 1. In this arrangement the noise signal, provided it lies above a communication frequency spectrum of the bus system used, is diverted via a high-pass filter which is connected to the system bus 2 on the input side and forwarded to an absorber resistor. Finally the absorber resistor absorbs the unwanted noise signal. The noise signal is therefore directly shunted away from the system bus so that no degradation of communication on the system bus occurs due to the noise signal. This represents an enormous advantage, in particular in the industrial automation environment.

FIG. 2 shows a two-wire system bus 2 which has an absorber unit 1. In this example embodiment, the two-wire system bus 2 represents an AS-Interface bus 2. In this arrangement the AS-Interface bus 2 has a +line 12 and a −line 13. An absorber unit 1 is connected to the AS-Interface bus 2. The absorber unit 1 is connected to the AS-Interface bus system 2 via a high-pass filter 3. The high-pass filter 3 is dimensioned such that it has a low-impedance effect for noise signals that lie above the communication frequency spectrum used and so forwards the high-frequency signals to an absorber resistor 4. The high-frequency noise signals can thus be absorbed by the absorber unit 4. In this way unwanted noise signals that lie above the communication frequency spectrum used can be diverted via the absorber unit 1 on the AS-Interface bus 2 and absorbed, thereby reducing unwanted noise signals on the AS-Interface bus 2. The noise immunity of the AS-Interface bus system is enormously improved as a result. The communication reliability and load-carrying capacity of the AS-Interface bus system are substantially improved.

FIG. 3 shows a schematic diagram representing an absorber unit as a strongly attenuated series resonant circuit 5. In this arrangement the system bus 2 represents an AS-Interface bus. The AS-Interface bus 2 has a +line 12 and a −line 13. In order to tap unwanted noise signals on the AS-Interface bus 2, a strongly attenuated series resonant circuit 5 is used in this case. The strongly attenuated series resonant circuit 5 consists of a high-pass filter, which in this exemplary embodiment is realized by way of a resonant circuit 15, and an absorber resistor 4. The series resonant circuit 15 is implemented at a resonant frequency of approx. 8 MHz. The series resonant circuit 15 is in this case formed by a 68 pF capacitor 6 and a 5.6 uH coil 7. In this scheme a first resistor 8 with a resistance of 47 ohms and a second resistor 9 with a resistance of 470 ohms are specified as the absorber resistor 4. A plurality of experiments have shown that an optimal result for an AS-Interface bus 2 in terms of the elimination of unwanted noise signals on the AS-Interface bus 2 is achieved by means of a strongly attenuated series resonant circuit 5 in such a constellation.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. An absorber unit configured to increase noise immunity of a system bus, the system bus being configured to enable communication to take place in a defined communication frequency spectrum, the absorber unit comprising:

a high-pass filter; and an absorber resistor, wherein the high-pass filter is connectable to the system bus on an input side and is connectable to the absorber resistor on an output side, the high-pass filter being configured to have a low-impedance effect for noise signals that are above the defined communication frequency spectrum so that the noise signals are absorbed by the absorber resistor, and the absorber unit is embodied by an attenuated series resonant circuit.

2. The absorber unit as claimed in claim 1, wherein the system bus represents an AS-Interface bus.

3. A master, comprising:

an absorber unit as claimed in claim 1, wherein the absorber unit is integrated in the master, which is configured for communication on the system bus.

4. A power supply, comprising:
an absorber unit as claimed in claim 1, wherein the absorber unit is integrated in the power supply, which is configured for the system bus.

5. A system bus, comprising:
an absorber unit as claimed in claim 1, wherein the absorber unit is connected to the system bus at one end of the system bus.

6. A system bus, comprising:
an absorber unit as claimed in claim 1, wherein the absorber unit is connected to the system bus in the vicinity of a source of interference.

7. The absorber unit as claimed in claim 1, wherein the absorber unit is embodied by a strongly attenuated series resonant circuit.

8. The absorber unit as claimed in claim 7, wherein a resonant frequency of the strongly attenuated series resonant circuit is between 6 MHz and 10 MHz.

9. The absorber unit as claimed in claim 8, wherein a resonant frequency of the strongly attenuated series resonant circuit is 8 MHz.

10. The absorber unit as claimed in claim 1, wherein the defined communication frequency spectrum between 40 kHz and 500 kHz.

11. A master, comprising:
an absorber unit as claimed in claim 10, wherein the absorber unit is integrated in the master, which is configured for communication on the system bus.

12. A power supply, comprising:
an absorber unit as claimed in claim 10, wherein the absorber unit is integrated in the power supply, which is configured for the system bus.

13. A system bus, comprising:
an absorber unit as claimed in claim 10, wherein the absorber unit is connected to the system bus at one end of the system bus.

14. A system bus, comprising:
an absorber unit as claimed in claim 10, wherein the absorber unit is connected to the system bus in the vicinity of a source of interference.

15. A method for increasing noise immunity of a system bus, wherein communication takes place in a defined communication frequency spectrum on the system bus, the method comprising:
connecting a high-pass filter to the system bus on an input side; and
connecting the high-pass filter to an absorber resistor on an output side, the high pass filter having a low-impedance effect for noise signals that are above the defined communication frequency spectrum so that the noise signals are absorbed by the absorber resistor, the absorber unit being embodied by an attenuated series resonant circuit.

16. The method as claimed in claim 15, wherein the defined communication frequency spectrum is defined to lie between 40 kHz and 500 kHz.

17. The method as claimed in claim 15, wherein the system bus represents an AS-Interface bus.

18. The method as claimed in claim 15, wherein the absorber unit is embodied by a strongly attenuated series resonant circuit.

19. The method as claimed in claim 18, wherein a resonant frequency of the strongly attenuated series resonant circuit is between 6 MHz and 10 MHz.

20. The method as claimed in claim 19, wherein a resonant frequency of the strongly attenuated series resonant circuit is 8 MHz.

* * * * *